(12) United States Patent
Van Schaijk et al.

(10) Patent No.: US 7,443,725 B2
(45) Date of Patent: Oct. 28, 2008

(54) FLOATING GATE ISOLATION AND METHOD OF MAKING THE SAME

(75) Inventors: Robertus Theodorus Fransiscus Van Schaijk, Leuven (BE); Michiel Slotboom, Leuven (BE)

(73) Assignee: NXP B.V., Eindhoven (NL)

( * ) Notice: Subject to any disclaimer, the term of this patent is extended or adjusted under 35 U.S.C. 154(b) by 548 days.

(21) Appl. No.: 10/542,833

(22) PCT Filed: Dec. 16, 2003

(86) PCT No.: PCT/IB03/06184

§ 371 (c)(1),
(2), (4) Date: Jul. 20, 2005

(87) PCT Pub. No.: WO2004/066389

PCT Pub. Date: Aug. 5, 2004

(65) Prior Publication Data

US 2006/0237769 A1   Oct. 26, 2006

(30) Foreign Application Priority Data

Jan. 22, 2003   (EP) .................................. 03100124

(51) Int. Cl.
   *G11C 16/04* (2006.01)
   *H01L 29/788* (2006.01)
   *H01L 21/336* (2006.01)

(52) U.S. Cl. .................. 365/185.05; 365/185.11; 365/185.12; 365/185.13; 257/317; 438/257

(58) Field of Classification Search ................. 257/317; 438/257; 365/185.05, 185.11, 185.12, 185.13
   See application file for complete search history.

(56) References Cited

U.S. PATENT DOCUMENTS

| 5,488,244 | A  |   | 1/1996  | Quek et al. |
| 5,566,106 | A  | * | 10/1996 | Bergemont ............ 365/185.33 |
| 5,643,813 | A  |   | 7/1997  | Acocella et al. |
| 5,889,304 | A  | * | 3/1999  | Watanabe et al. ............ 257/321 |
| 6,060,358 | A  |   | 5/2000  | Bracchitta et al. |
| 6,146,970 | A  |   | 11/2000 | Witek et al. |
| 6,261,905 | B1 |   | 7/2001  | Chen et al. |
| 6,309,926 | B1 | * | 10/2001 | Bell et al. .................... 438/257 |
| 6,365,459 | B1 |   | 4/2002  | Leu |
| 6,573,139 | B2 | * | 6/2003  | Lee et al. ..................... 438/257 |
| 6,614,072 | B2 | * | 9/2003  | Sandhu et al. .............. 257/317 |

* cited by examiner

*Primary Examiner*—Evan Pert
(74) *Attorney, Agent, or Firm*—Peter Zawilski

(57) ABSTRACT

The present invention relates to a method for forming a set of floating gates which are isolated from each other by means of slits, as well as semiconductor devices using the floating gate. The present invention provides a method for manufacturing an array of semiconductor devices on a substrate (10), each device having a floating gate (36), comprising: first forming isolation zones (14) in the substrate (10), thereafter forming a floating gate separator (32) on the isolation zones (14) at locations where separations between adjacent floating gates (36) are to be formed, after forming the floating gate separator (32), forming the floating gates (36) on the substrate (10) between parts of the floating gate separator (32), and thereafter removing the floating gate separator (32) so as to obtain slits in between neighboring floating gates (36). This method has an advantage over prior art in that less residues of floating gate material, or less floating gate material shorts between adjacent floating gates occur. Furthermore, the gate profile is damaged less than in prior art slit processing methods.

18 Claims, 7 Drawing Sheets

FLOATING GATE ISOLATION AND METHOD OF MAKING THE SAME

The present invention relates to a method for forming a set of floating gates (FG) which are isolated from each other by means of slits, as well as semiconductor devices using the floating gate. The FGs are useful in the manufacture of ultra high-density non-volatile memories (NVM). Some examples of NVMs include an EPROM, an EEPROM and a flash memory cell.

NVMs are used in a wide variety of commercial and military electronic devices and equipment, such as, for example, hand-held telephones, radios and digital cameras. The market for these electronic devices continues to require devices with a lower voltage, lower power consumption and a decreased chip size.

Flash memories or flash memory cells conventionally comprise a MOSFET with a (or a plurality of) floating gate(s) between a control gate (CG) and a channel region, the FGs and the CG being separated by a thin dielectric layer. With the improvement of fabrication technologies, the FG size and the space between FGs has been reduced to sub-micrometer scale. These devices are basically miniature EEPROM cells in which electrons (or holes) are injected through an oxide barrier into a FG. Charges stored in the FG modify the device threshold voltage. In this way, data is stored. The CG controls the FG. The FG to CG coupling ratio, which is related to the areal overlap between the FG and the CG, affects the read/write speed of the flash memory. Furthermore, the better the coupling ratio, the more the required operation voltage of the memory cell can be reduced.

Stacked gate technology is applied in the fabrication of modern NVM cells with very high density, as shown in FIG. 1. In a stacked gate technology, the CG 2 and the FG 4 are etched in a self-aligned manner in one and the same patterning step, in a direction perpendicular to the view of FIG. 1. FIG. 1 shows a cross-section in a direction along a word line of the NVM cell. It is shown that FGs 4 are located apart from each other to assure isolation of the FGs 4 in this direction. This is achieved by etching FG slits 6 in the bottom polysilicon gate (FG) prior to depositing an interpoly dielectric (IPD) 8 and a CG polysilicon layer. The slits 6 can either be continuous lines (long slits) in a direction perpendicular to the plane of the paper, or separated small slits (short slit openings). The slits 6 are etched into the FG polysilicon to isolate adjacent FGs 4. The slit etch should be very straight, otherwise polysilicon short between different FGs 4 can occur. These polysilicon shorts cause serious reliability problems for the NVM.

The contribution of the potential on the CG 2, VCG, to the potential on the FG 4, $V_{FG}$, in a non-volatile memory (NVM) cell, is determined by the FG to CG coupling ratio, $\alpha_{FC}$:

$$V_{FG} = \alpha_{FC} \times V_{CG}$$

The FG to CG coupling ratio is determined by: $\alpha_{FC} = C_{FC}/C_{tot}$ where $C_{FC}$ is the capacitance between FG 4 and CG 2, and $C_{tot}$ is the total capacitance of the FG 4.

In order to achieve maximum FG to CG coupling, the capacitance $C_{FC}$ between FG 4 and CG 2 must be maximized, and/or the total capacitance of the FG 4 must be minimized.

One solution for improving the FG to CG coupling ratio is to increase the dimensions of the FG 4, thus increasing the overlap area of the CG over the FG in the X-direction in FIG. 1, so as to increase the capacitance $C_{FC}$. This, however, limits the ability to reduce the cell size and thus impedes device density improvements. Maximum density requires minimum spaces between FGs 4, or thus minimum width of slits 6. Slit dimensions are presently limited by lithographic processes used in manufacturing the gate stacks.

A problem with down scaling of NVMs with polysilicon FG 4 is formed by the small slits 6, which are the separation between adjacent FGs 4. These slits 6 become very small due to the fact that the coupling between FG 4 and CG 2 should remain constant with scaling. And in fact, an increase in coupling would even be better, because this reduces the program and erase voltages needed, and thus reduces power consumption. One way to obtain a higher coupling, is to decrease the size (width) of the slits 6.

It is known from U.S. Pat. No. 6,214,667 to make small slits by using nitride ($Si_3N_4$) spacers next to the FGs. In this technique, slits are etched in a (relative thick) nitride layer on top of the FGs. Next, nitride sidewall spacers are formed. The nitride layer including spacers functions as a hard mask for the FG slit etch. A disadvantage of this method is the removal of the nitride, for example with $H_3PO_4$ phosphoric acid that etches (especially doped) polysilicon. This requires a trade-off between leaving behind nitride residues and causing a rough FG surface. Both situations will lead to inter-poly dielectric (IPD) reliability problems.

It is an object of the present invention to provide an array of floating gate semiconductor devices which are isolated from each other, in which, during isolation of the floating gates from each other, less damage to the gate profile is applied, and in which, after isolating the floating gates from each other, less residues of floating gate material or gate material shorts between adjacent floating gates are present.

The above objective is accomplished by a method and device according to the present invention.

The present invention provides a method for manufacturing an array of semiconductor devices on a substrate, each device having a floating gate, comprising:

first forming isolation zones in the substrate, thereafter forming a floating gate separator on the isolation zones at locations where separations between adjacent floating gates are to be formed, after forming the floating gate separator, forming the floating gates on the substrate between parts of the floating gate separator, and thereafter removing the floating gate separator so as to obtain slits in between neighboring floating gates.

This method has an advantage over prior art in that less residues of floating gate material, e.g. polysilicon residues, or less floating gate material shorts between adjacent floating gates occur. Furthermore, the gate profile is damaged less than in prior art slit processing methods.

A method according to the present invention may furthermore comprise, after forming of the floating gate separator and before forming of the floating gate, reducing the dimensions of the floating gate separator. This way, smaller slits are obtained in an easy way. The dimensions of the floating gate separator may be reduced to sub-lithographic dimensions, whereby dimensions depend on technology node or state of the art and on process conditions. For example for 90 nm generations and beyond, the dimensions of the floating gate separator may reduced to between 100 nm and 40 nm.

In the case of reduction of the dimensions of the floating gate separator to sub-lithographic dimensions, slits smaller than the minimum lithographic critical dimension are obtained, which increases the FG/CG coupling of the device obtained The dimensions of the floating gate separator may be reduced by lithographic techniques such as resist shrink, which is a reliable and very cheap method, and phase-shift lithography. Alternatively, the dimensions of the floating gate separator may be reduced by trim plasma etching or by an isotropic over-etch of the floating gate separator. The over-etch is only done after floating gate separator formation.

The floating gate separator may comprise nitride material, which allows a selective etching to be done when removing the floating gate separator. The floating gate separator may comprise at least two layers of different material, such as for example oxide and nitride. This latter solution gives less problems with degradation of highly doped floating gate material, e.g. highly doped polysilicon, when removing the floating gate separator.

The method according to the present invention may furthermore comprise forming a control gate on top of the floating gates, so as to form a device which can be used in NVMs.

According to an embodiment of the present invention, spacers may be formed next to the floating gate separator before forming the floating gates. This way, a sharp tip of floating gate material, e.g. polysilicon, can be obtained in the FG, which is useful for poly-poly erase. With a sharp tip is meant that tangents to the upper, flat surface of the floating gate, and the portion of the upstanding wall of the floating gate where it is adjacent the upper surface, include an angle of less than 90 degrees, preferably less than 70 degrees, still more preferred less than 50 degrees.

The forming of the floating gates may comprises removing floating gate material by chemical-mechanical polishing. This way, a flat FG surface is obtained, which is advantageous for the reliability of the memory formed using this FG.

A method according to the present invention may furthermore comprise, after removing the floating gate separator, doping the floating gates.

The present invention also provides an array of semiconductor devices with a floating-gate to control-gate coupling ratio, comprising:
  a substrate with a planar surface,
  an isolation zone in the substrate in the planar surface,
  at least two floating gates extending on the substrate in a first direction, each floating gate partially overlapping the isolation zone and comprising floating gate material, such as e.g. polysilicon,
  a slit between the two floating gates, and
  a control gate extending laterally with respect to the planar surface over the floating gates,
wherein at least one of the floating gates is provided with a sharp tip of floating gate material both in the first direction and in a second direction including an angle with the first direction. his second direction may be perpendicular to the first direction. With a sharp tip is meant that tangents to the upper, flat surface of the floating gate, and the portion of the upstanding wall of the floating gate where it is adjacent the upper surface, include an angle of less than 90 degrees, preferably less than 70 degrees, still more preferred less than 50 degrees.

In an array of semiconductor devices according to the present invention, the slit between two adjacent floating gates may be a sub-lithographically dimensioned slit. This is advantageous for the floating-gate to control-gate coupling ratio.

The floating gate may have a flat top surface, which is advantageous for the reliability of a memory formed using this FG.

The present invention also provides a non-volatile memory including an array of semiconductor devices according to the present invention. The memory may be a flash memory or an EEPROM for example.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
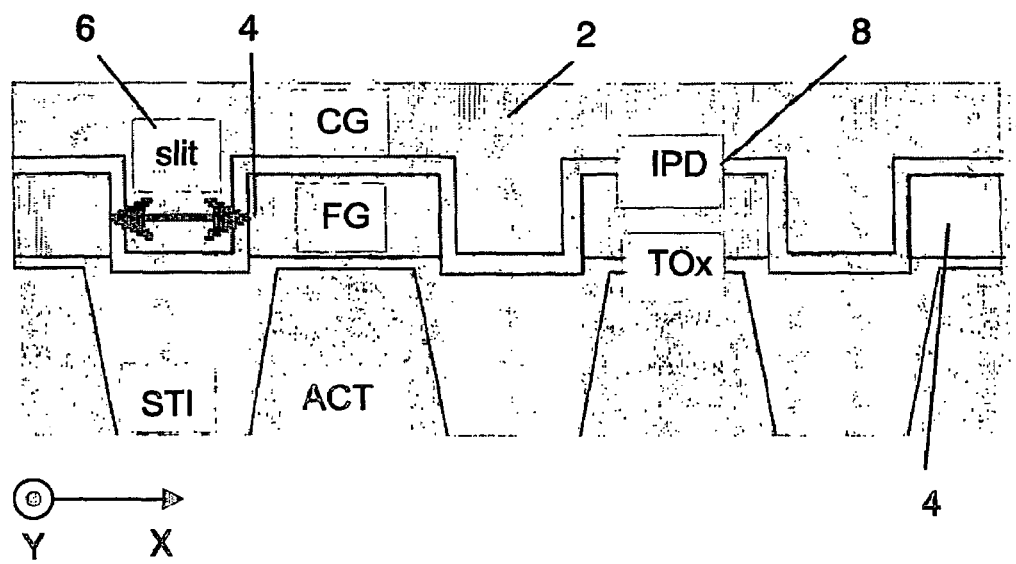
FIG. 1 shows a cross-section of a prior art NVM cell, in a direction along a word line.

In the different drawings, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, in a first step, a substrate 10 or a well in a substrate is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, and silicon-on sapphire substrates. The term "substrate" is thus used to define generally the elements for layers that underlie a layer or portions of interest. Also, the "substrate" may be any other base on which a layer is formed, for example a glass or metal layer. In the following processing will mainly be described with reference to silicon processing but the skilled person-will appreciate that the present invention may be implemented based on other semiconductor material systems and that the skilled person can select suitable materials as equivalents of the dielectric and conductive materials described below.

Figure 2:
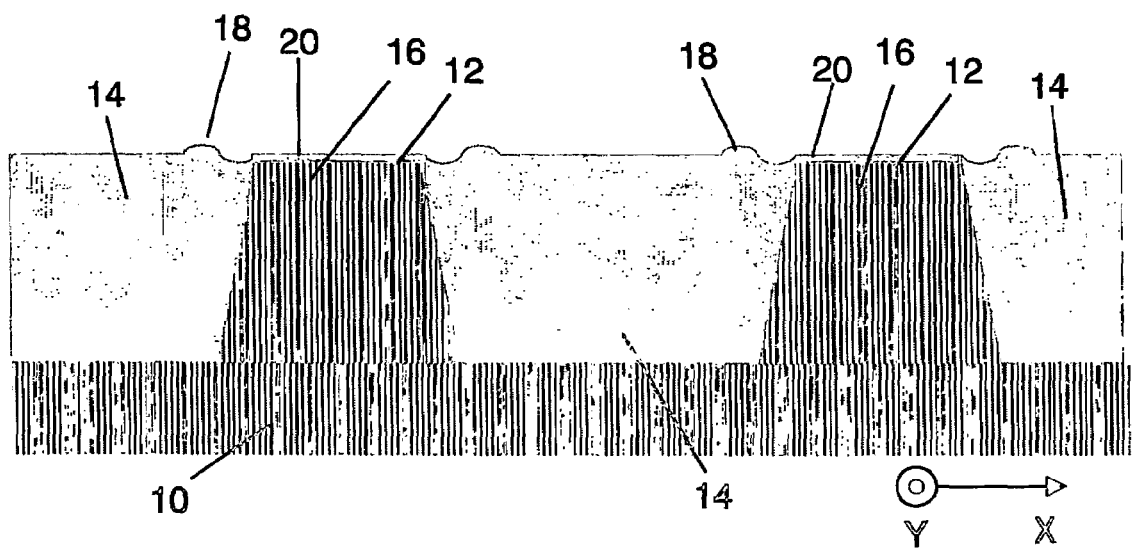
FIG. 2 shows a cross-section of a substrate provided with isolation zones and sacrificial oxide.

As shown in FIG. 2, this well or substrate 10 has a surface 12 and is provided with isolation zones such as shallow trench isolation (STI) zones 14 or thermally grown field oxide (LOCOS) regions, in order to isolate subsequent (as seen in the X-direction as defined in FIG. 1) memory cells from each other. Between two STI or LOCOS isolation zones 14, the remaining substrate 10 will form an active area 16.

STI isolation zones 14 may be formed by initially creating a shallow trench in semiconductor substrate 10, e.g. by a conventional photolithographic and anisotropic dry etch process such as a reactive ion etching (RIE) procedure, using e.g. $Cl_2$ as etchant. The shallow trench is created to a depth of for example between about 200 to 600 nm in the semiconductor substrate 10. After removal of the photoresist pattern, used for shallow trench definition, by plasma oxygen ashing and careful wet cleans, a silicon oxide layer is deposited, for example by a low pressure chemical vapor deposition (LPCVD) procedure or by a plasma enhanced chemical vapor deposition (PECVD) procedure, to a thickness between about 300 to 1500 nm. The shallow trenches are thus completely filled. Removal of the silicon oxide from regions other than inside the shallow trenches is accomplished using either a chemical mechanical polishing (CMP) procedure, or via a RIE procedure using a suitable etchant, resulting in insulator filled STI regions 14.

Depending on the procedure used, the shallow trench isolation can give rise to topographic unevenness 18 next to the active area 16. This unevenness 18 is formed during the etch back of the oxide (HF dip) to level the oxide in the trench to the same height as the active areas 16. When a memory stack, comprising FG and CG, is deposited on such an STI topography with unevenness 18, this topography remains through the whole stack due to conformal deposition of gate material, e.g. polysilicon layers. This can introduce etch problems further in the processing of non-volatile memories.

If instead of STI zones 14, LOCOS regions are used, they may be formed via initially forming an oxidation resistant mask, such as silicon nitride, then exposing regions of the semiconductor substrate 10 not protected by the silicon nitride masking pattern, to a thermal oxidation procedure. LOCOS regions are thus created at a thickness equal to the depth of STI zones 14. After formation of the LOCOS region, the oxidation resistant mask is removed.

STI zones 14 are preferred over LOCOS regions as they can be formed in a smaller dimension than that of the LOCOS regions, which allows the reduction of the cell dimensions, so that cell density can be increased Furthermore, LOCOS has much more topographic unevenness than STI and will introduce some constraints on the floating gate material thickness.

Therefore, in the following description, only STI zones 14 are further considered, but it should be understood that the present invention includes the process steps described below carried out with LOCOS regions.

As shown in FIG. 2, on top of the substrate 10 provided with STI zones 14, an insulating layer, e.g. a sacrificial oxide layer 20, comprising e.g. silicon dioxide, is formed, preferably by thermally growing it in an oxygen-steam ambient, at a temperature between about 600 to 1000° C., to a thickness between about 6 to 15 nm. Alternatively Rapid Thermal Oxidation (RTO) with in-situ steam generation (ISSG) can be used to obtain the sacrificial oxide layer 20.

Figure 3:
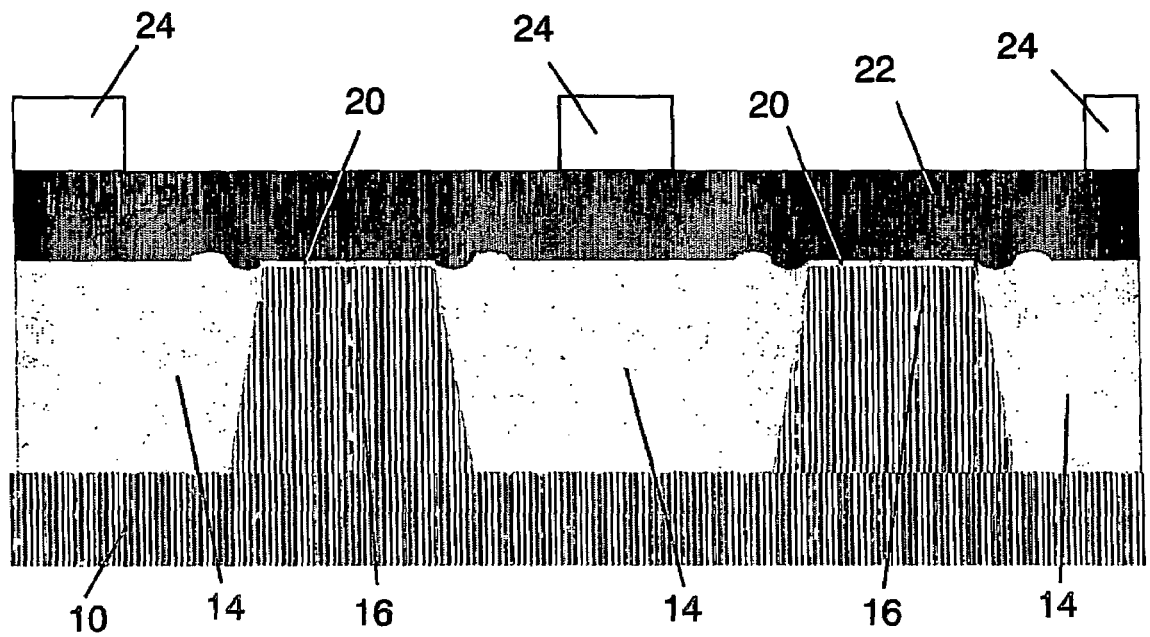
FIG. 3 shows the cross-section of FIG. 2 after formation of a layer of sacrificial floating gate separation material with on top thereof a floating gate separator resist, according to a first embodiment of the present invention.

According to the present invention, after STI processing as shown in FIG. 2, a thick layer 22 of sacrificial floating gate separation material is deposited on top of the insulating sacrificial oxide 20. This layer 22 of sacrificial floating gate separation material is a layer which can be selectively removed, without removing any (or a significant amount) of the oxide present (neither STI 14 nor sacrificial oxide 20). The layer 22 of sacrificial floating gate separation material may, for example, be a thick layer of nitride, as shown in FIG. 3. Alternatively, the layer 22 of sacrificial floating gate separation material may for example consist of two layers, e.g. a thin layer of nitride with on top thereof a thick layer of oxide, whereby the thin layer of nitride will function as a stopping layer when later on removing the thick layer of oxide. The latter approach can provide advantages for the removal at the end of the processing, as explained later on. The thick layer 22 of sacrificial floating gate separation material preferably has the same thickness as the FG 36 which is to be formed on a later stage in the processing.

An etch mask, preferably a sub-lithographic dimensioned etch mask, is created, e.g. using a resist layer. This is applied on top of the thick layer 22 of sacrificial floating gate separation material, and some parts thereof (depending on the desired pattern) are exposed, so as to pattern the resist by a common exposure step. Subsequently, the non-exposed parts (or the exposed parts, depending on the kind of resist used) are washed away, leaving behind a certain pattern of resist, allowing layers not covered by the remaining resist layer to be etched away. A floating gate separator resist 24 is obtained, as shown in FIG. 3. The floating gate separator resist 24 is the inverse of the slit mask with the same function in "standard" flash processing. It is a mask which covers locations where slits are to be formed, and which leaves other locations free. The floating gate separator resist 24 can be at minimum critical dimensions (CD).

After development of the resist layer, the size of the floating gate separator resist 24 may be reduced, e.g. by using resist shrink (UV bake) or resist ash (trim plasma etching by means of $O_2$ plasma). If the floating gate separator resist 24 was developed having a minimal CD, then after reduction it has sub-lithographic dimensions. Especially the resist shrink is a reliable and very economic and easy way to get sub-lithographic dimensions. The CD can be reduced with this technique by about 30-50 nm. Of course smaller dimensions can also be obtained by phase-shift lithography.

Figure 4:
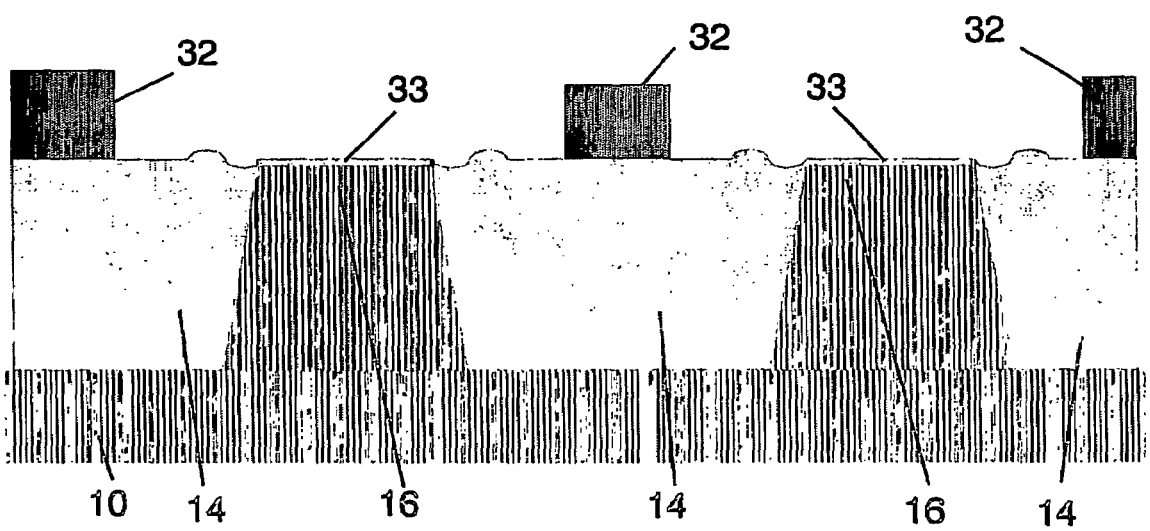
FIG. 4 shows a cross-section after floating gate separation material etch, stripping of the floating gate separator resist and formation of tunnel oxide according to an embodiment of the present invention.

The thick layer 22 of sacrificial floating gate separation material is then etched, using the exposed and developed and possibly reduced floating gate separator resist 24. If the thick layer 22 of sacrificial floating gate separation material comprises one material, such as e.g. nitride, this nitride is etched with end point on oxide (STI 14 and sacrificial oxide 20). The floating gate separator resist 24 is stripped. A floating gate separator 32 is obtained. The result is shown in FIG. 4. If the thick layer 22 of sacrificial floating gate separation material consists of e.g. a thick layer of oxide on top of a thin layer of nitride, first the oxide is etched using the floating gate separator resist 24, and thereafter the nitride layer is removed with etch stop on oxide 14, 20. Here also, the resist 24 is stripped. A floating gate separator 32 is obtained.

Another option to reduce dimensions of the floating gate separator 32 can be a short anisotropic over-etch after the etch of the layer of sacrificial floating gate separation material, a nitride etch in the example given (i.e. after the result shown in FIG. 4). Alternatively, instead of an anisotropic nitride etch a more isotropic nitride etch can be used. This introduces a tapered profile instead of a straight nitride slope. This tapering cannot cause any polysilicon shorts between different floating polysilicon gates 36. With a standard slit etch (prior art), polysilicon shorts are between adjacent floating gates 36 causing a reliability problem.

In principle after dry nitride etch and stripping of the floating gate separator resist 24, also a short wet nitride etch (isotropic) can be used to reduce the CD.

All the above options can be used to decrease the CD. The options can be performed separately or in any combination. Except for phase-shift lithography, the mentioned ways of doing CD reduction cannot be done with standard slit processing.

During floating gate separator 32 formation, the removal of the sacrificial floating gate separation material, e.g. nitride, will damage the sacrificial oxide 20. After the floating gate separator 32 formation, the sacrificial oxide 20 (or the remainder of this oxide) can be dipped away, e.g. with HF, and tunnel oxide 33 can be provided, for example by growing it.

Figure 5:
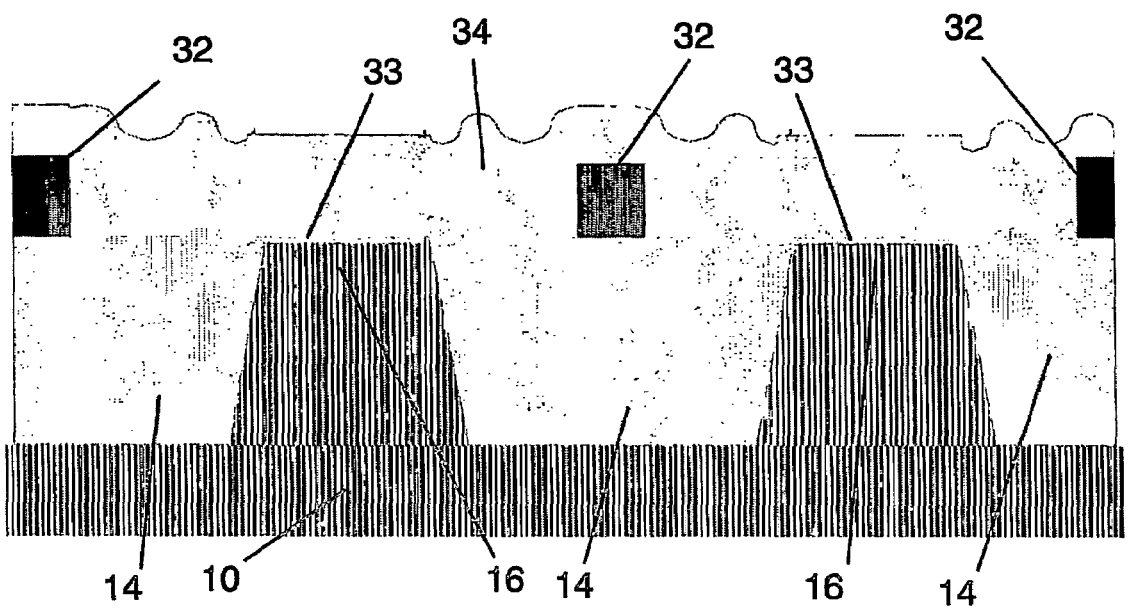
FIG. 5 shows the cross-section of FIG. 4 after FG polysilicon deposition.

A next step, after having obtained the tunnel oxide 33, is the formation of FG material, e.g. deposition of the FG polysilicon 34, as shown in FIG. 5. On top of the tunnel oxide 33 and over the floating gate separator 32, a first polysilicon layer 34 is deposited, which will later on form the FGs 36. The deposition of the first polysilicon layer 34 is preferably done by a CVD procedure, to a thickness between about 50 to 400 nm. Doping of the polysilicon layer 34 is either accomplished in situ, during deposition, e.g. via the addition of arsine or phosphine to a silane ambient, or via an ion implantation procedure, using for example arsenic, phosphorous or boron ions applied to an intrinsic polysilicon layer.

Figure 6:
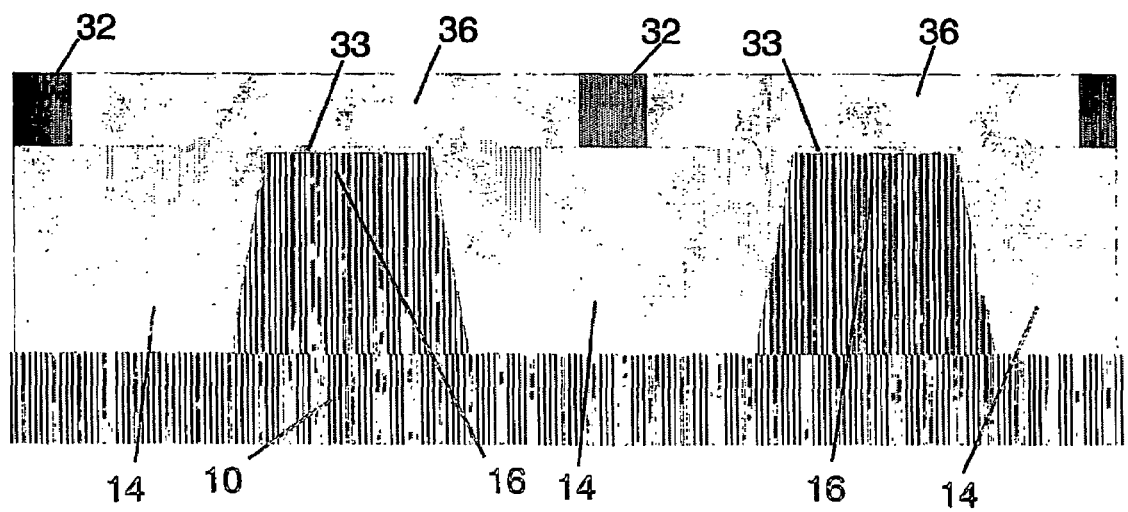
FIG. 6 shows the cross-section of FIG. 5 after polysilicon CMP.

As is shown in FIG. 5, the polysilicon deposition follows the topography of the wafer (also the STI topography). Next, according to the present invention, the polysilicon layer 34 is processed, e.g. polished down, to the same height as the floating gate separator 32, e.g. by polysilicon chemical mechanical polishing (CMP). All unwanted topography is removed after polysilicon CMP, and FGs are formed, as shown in FIG. 6. This polysilicon CMP step should be selective towards the top material of the floating gate separator 32, in the examples given either nitride for the thick nitride layer, or oxide for the combined oxide/nitride layer. Due to the polysilicon CMP step, the top of the FG 36 is very flat and this is advantageous for the reliability of the memory. Prior art FG polysilicon can have sharp grain boundaries on top, with associated reliability problems (charge leakage).

The floating gate separator 32 is then removed. The nitride of the floating gate separator 32 can be e.g. etched away with a wet etch. This, however, can cause problems with highly doped polysilicon of the FG 36. For this reason, instead of nitride, a double layer of nitride and oxide may be used and is usually preferred. If a thin nitride layer and a thick oxide layer are deposited instead of the thick nitride layer, then after the polysilicon-CMP step, first the oxide can be etched away by means of a wet etch with HF, which is selective towards the thin nitride layer underneath. This does not damage the highly doped FG 36. The thin nitride layer protects the STI oxide 14 during the HF etch. Only thereafter is the thin nitride layer removed, e.g. by etching, which takes much less time in view of the smaller thickness of the nitride layer, and therefore is less damaging to the FG material.

Another way to prevent problems with the wet etch is to carry out the implantation of the FG polysilicon 36 only after wet removal of the nitride of the floating gate separator 32.

Figure 7:
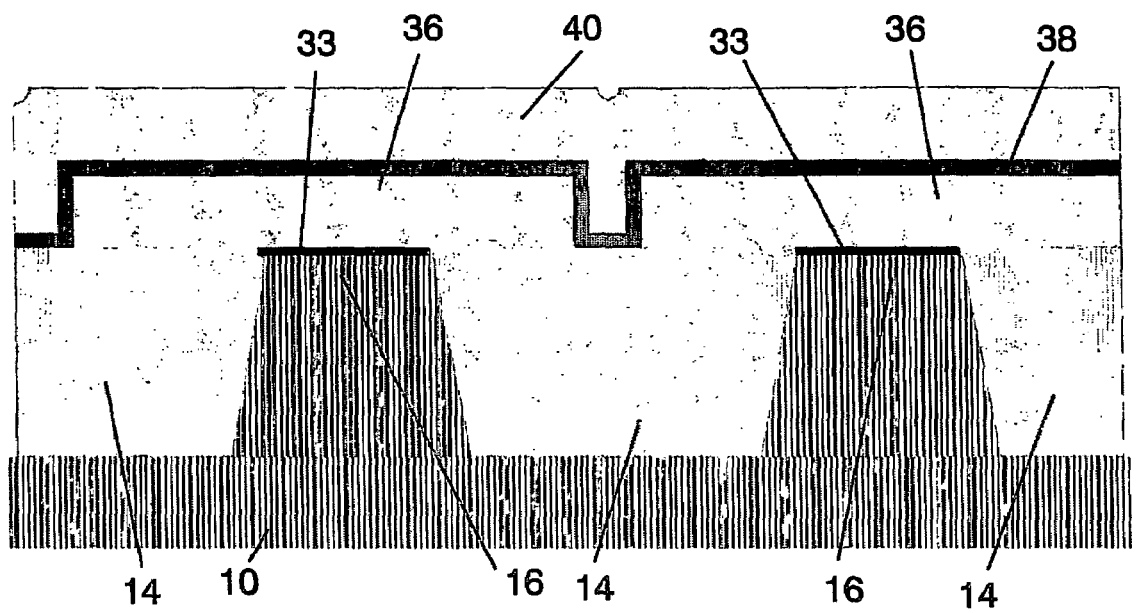
FIG. 7 shows the cross-section of FIG. 6 after IPD and CG formation.

After removing the floating gate separator 32, e.g. nitride or oxide and nitride, an interpoly dielectric (IPD) 38 is formed, see FIG. 7. The IPD 38 preferably comprises a plurality of insulating materials, e.g. an Oxide Nitride Oxide (ONO) layer, and may be formed or grown by conventional techniques. An ONO layer preferably comprises successive layers of silicon dioxide, silicon nitride and silicon dioxide. The total dielectric thickness of the ONO layer generally is between about 10 to 50 nm.

After forming the IPD layer 38, CG polysilicon 40 is deposited (preferably in situ doped), as shown in FIG. 7. The deposition of the CG polysilicon layer 40 may be done by LPCVD procedures, to a thickness between about 50 to 400 nm. Doping of the CG polysilicon layer 40 is either accomplished in situ, during deposition, via the addition of a suitable dopant impurity such as arsine or phosphine to a silane ambient, or via an ion implantation procedure, using such a dopant, e.g. arsenic, phosphorous or boron ions applied to an intrinsically polysilicon layer.

Figure 8:
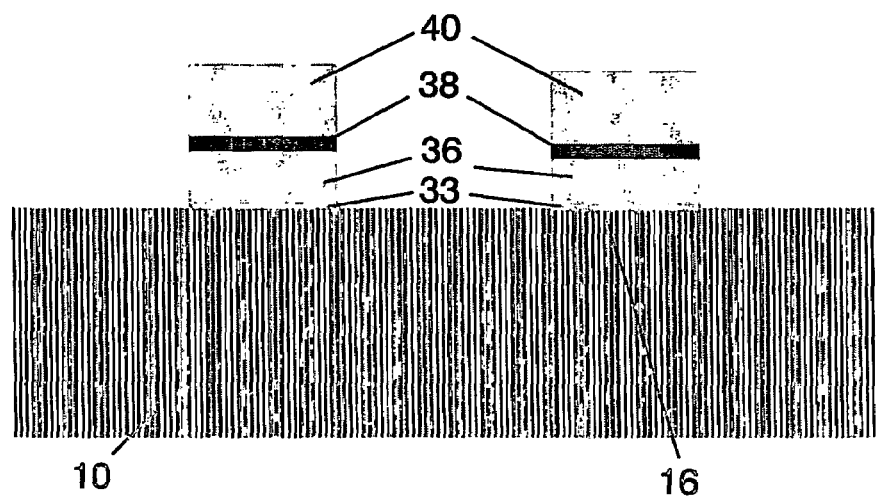
FIG. 8 illustrates an FG/CG stack in a cross-section perpendicular to the one of FIG. 7.

In a last step in the formation of a NVM according to the present invention, CG polysilicon 40 is patterned and etched. This forms the word lines of the memory, which can be seen in the cross section perpendicular to the one shown in FIG. 7. This is shown in FIG. 8.

Cell formation is finalized with processing as known by a person skilled in the art (e.g. MDD, spacers, HDD, source/drain formation, silicidation, contact, metalisation etc.—not represented in the drawings).

Figure 9:
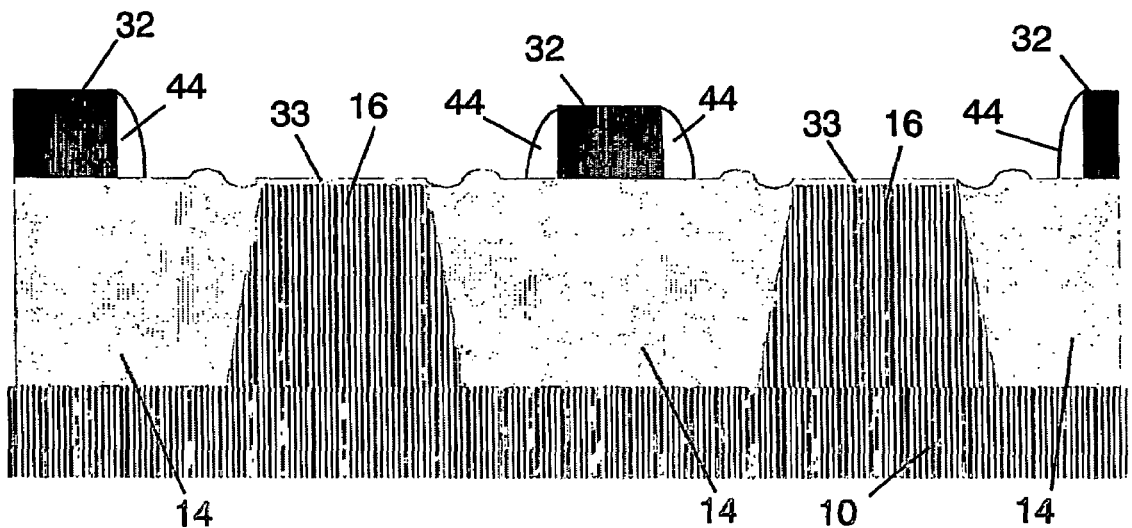
FIG. 9 illustrates, in cross-section, the formation of spacers next to the floating gate separator, according to a second embodiment of the present invention.

According to another embodiment of the present invention, spacers 44 can be formed next to the floating gate separator 32, e.g. nitride lines. There is started from FIG. 4, previous process steps being the same as for the first embodiment. Forming of spacers 44 can be done e.g. by deposition of a thin nitride layer and performing an anisotropic spacer etch. Attentively, an other material can be used. This material, however, should be removable after FG 36 formation. The result after formation of the spacers is shown in FIG. 9.

Figure 10:
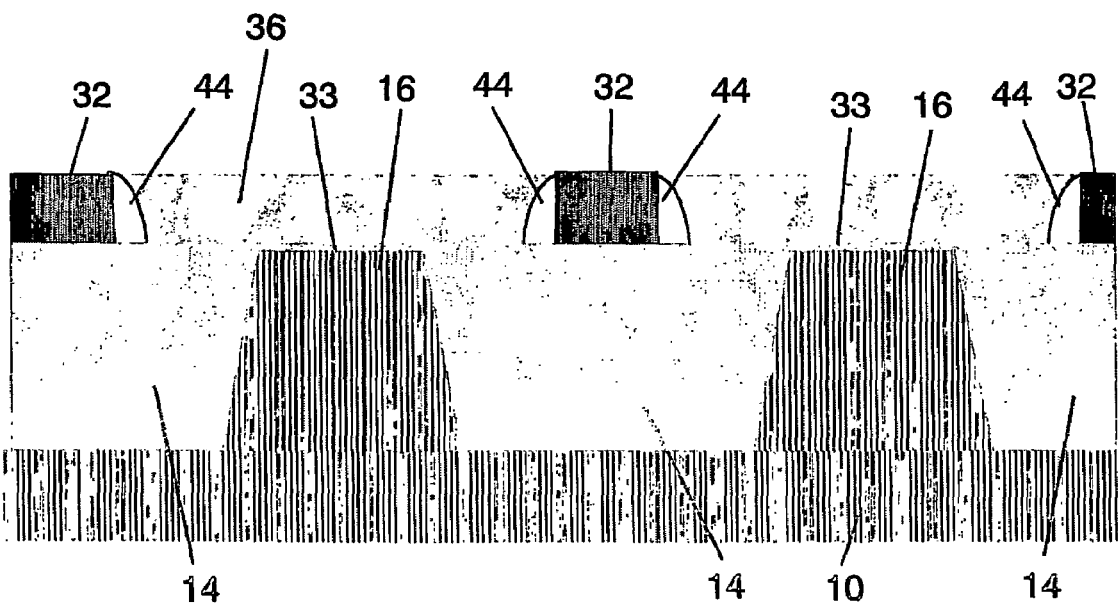
FIG. 10 is the cross-section of FIG. 9 after formation of FG.

Thereafter, FG polysilicon 34 is applied, and it is planarized by CMP as explained above for the first embodiment. The polysilicon-CMP stops on the top layer of the floating gate separator 32, and the result is shown in FIG. 10. FGs 36 have been formed.

The next step is the removal of the floating gate separator 32, e.g. nitride, and the spacers 44. This can be done e.g. with a wet etch ($H_3PO_4$ acid). If the spacers 44 are made of the same material as the floating gate separator 32, e.g. nitride, they will also be removed in the same etching step. If the FG polysilicon is highly doped, the nitride etch might slightly attack the FG polysilicon. This can be solved by implanting the FG polysilicon after nitride removal (so undoped polysilicon is used for FG deposition). Applying a dry etch is difficult, because this tends to be more anisotropic, and tends to not completely remove the spacers 44.

If the spacers 44 are made of a material which is different from the material of the floating gate separator 32, e.g. the spacer 44 material is oxide and the floating gate separator 32 material is nitride, the nitride can be removed with a dry etch. The oxide spacers 44 can then be removed by a HF etch. This HF etch also partly etches the STI oxide 14, but this is not a major problem. In fact, some loss of STI oxide can be advantageous, because the IPD layer 38 to be formed later on will then be below the FG polysilicon 36, and increased coupling between FG 36 and CG 40 will be obtained.

After removal of the floating gate separator 32, e.g. nitride, and the spacers 44, a sharp polysilicon tip 46 is obtained in the FG 36. With a sharp tip 46 is meant that tangents to the upper, flat surface of the FG 36, and the portion of the upstanding wall of the FG 36 where it is adjacent the upper surface, include an angle of less than 90 degrees, preferably less than 70 degrees, still more preferred less than 50 degrees. The IPD 38 is then formed. This IPD 38 can be formed e.g. by (CVD) deposition, which follows the shape of the FG polysilicon 36. For the IPD 38, e.g. oxide-nitride-oxide (ONO) can be used. A disadvantage of ONO can be the trapping of the charge in the nitride layer which lowers the erase efficiency. The IPD 38 can also be formed by thermal oxidation or by a combination of a thermal oxidation and an oxide deposition. A thermal oxidation will make the polysilicon tip 46 even sharper, and improves the field amplification. This sharp tip 46 can be advantageous in a cell concept where poly-poly erase is used. A common erase method for non-volatile memories is Fowler-Nordheim tunelling. This method needs relatively high voltages, which do not scale with transistor dimensions. Another way of erasing is with poly-poly erase, which allows scalability and lower voltages. Especially with a sharp tip 46 between the FG 36 and the CG 40, the erase efficiency is increased. The sharp tip 46 produces a high electric field between FG 36 and CG 40 during erasing.

Figure 11:
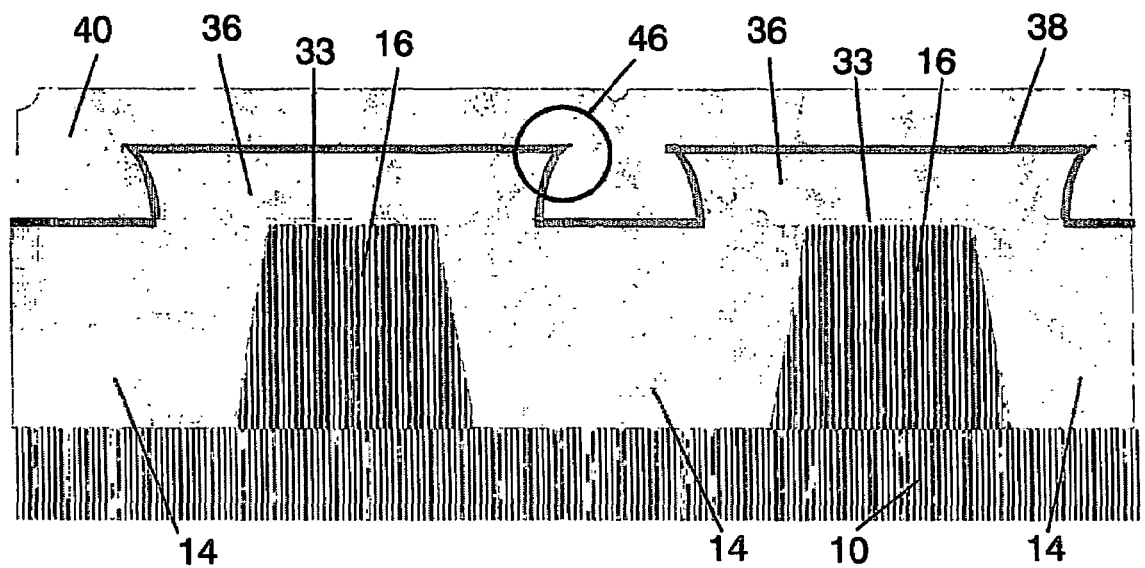
FIG. 11 is the cross-section of FIG. 10 after IPD and CG formation.

On top of the IPD 38 a CG polysilicon 40 is deposited. The result thereof is shown in FIG. 11.

After the CG polysihcon 40 deposition, the word lines (FG/CG stack) are patterned, and the rest of the transistor can be processed, as known by a person skilled in the art.

Figure 12:
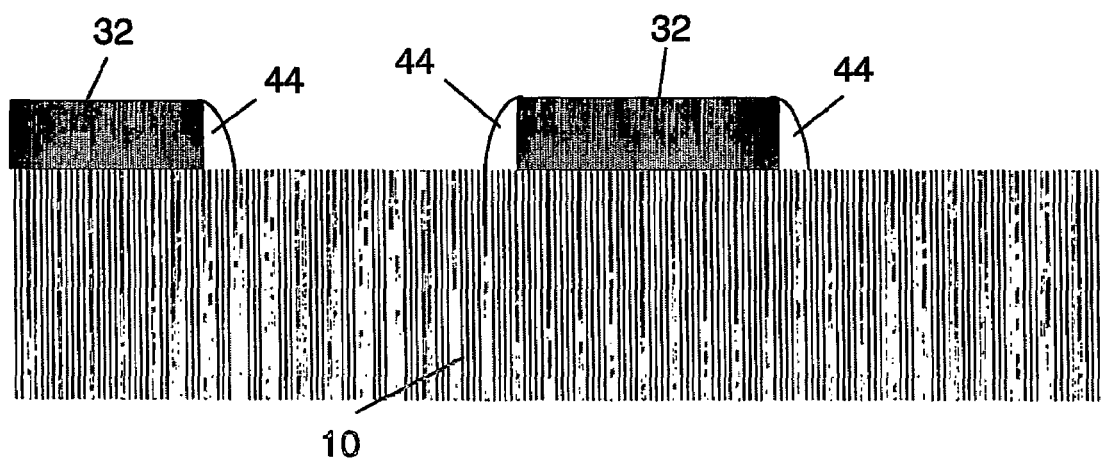
FIG. 12 is a cross-section perpendicular to the cross-section of FIG. 9, according to a third embodiment of the present invention.

In FIG. 8, the result for the stacked gate concept is shown (1 transistor cell). Of course, according to yet another embodiment of the present invention, a 2 transistor cell can also be processed (like the polysihcon-CMP cell concept as explained in WO 01/67517). If the split gate concept is used instead of stacked gate concept, a sharp polysilicon tip is formed in both bit line and word line directions. The cross sections in the word line direction are the same as the ones shown in FIG. 3, FIG. 4, FIG. 9, FIG. 10 and FIG. 11. In the bitline direction, the result after etching of layer 22 of sacrificial floating gate material and spacer 44 formation is shown in FIG. 12.

After FG polysilicon deposition and CMP and removal of floating gate separator 32 and spacers 44, the IPD 38 is formed. Also in this case ONO can be used, but then the gate dielectric of the select gate (or control gate) consists of ONO. In this case, a thermal oxidation to form the dielectric isolation on the FG 36 and the gate dielectric is preferred. Due to the high doping level of the FG 36, the oxidation thereof is faster than the oxidation of the silicon substrate 10, and a thicker oxide is formed on the FG 36 than on the surface 12 of the silicon substrate 10. A thermal oxidation will make the polysilicon tip 46 even sharper, which improves field amplification. Also a combination of thermal oxide and oxide deposition can be used.

Figure 13:
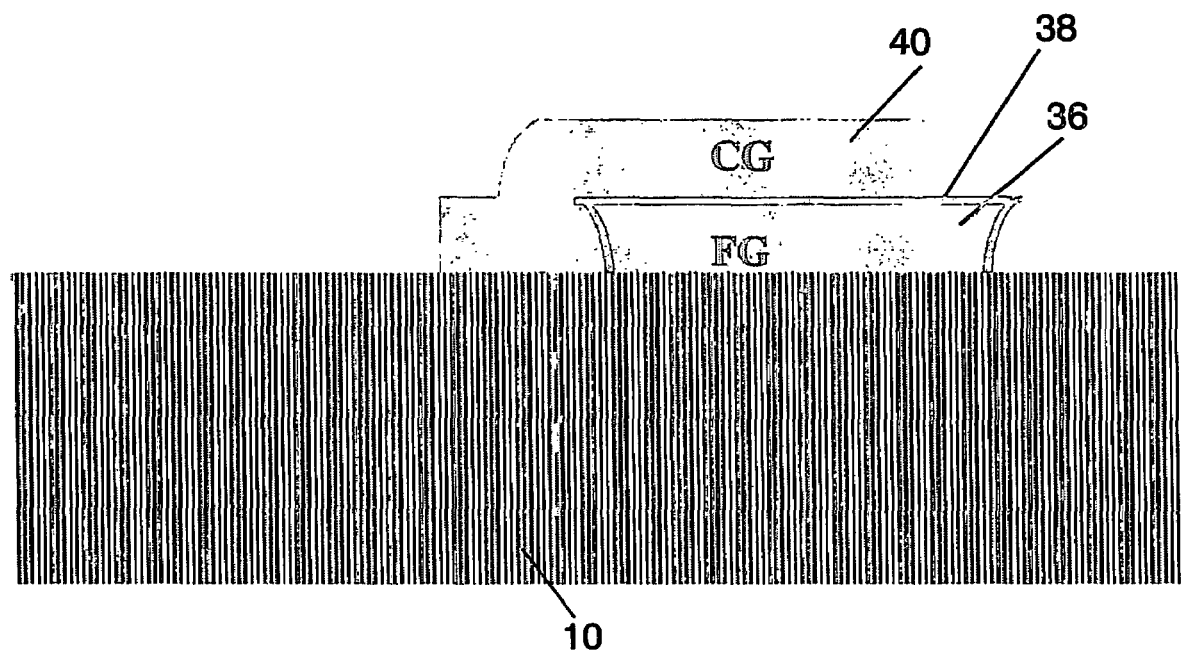
FIG. 13 is the cross-section of FIG. 12 after FG, IPD and CG formation.

FIG. 13 shows a cross-section in the bit line direction of the result after complete processing (no HDD spacers) of a split-gate cell.

It is to be understood that although preferred embodiments, specific constructions and configurations, as well as materials, have been discussed herein for devices according to the present invention, various changes or modifications in form and detail may be made without departing from the scope and spirit of this invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. Method for manufacturing an array of semiconductor devices on a substrate, each device having a floating gate, comprising:
    first forming isolation zones in the substrate,
    thereafter forming a floating gate separator on the isolation zones at locations where separations between adjacent floating gates are to be formed,
    after forming the floating gate separator, forming the floating gates, with spacers adjacent thereto, on the substrate between parts of the floating gate separator, and
    thereafter removing the floating gate separator so as to obtain slits in between neighboring floating gates.

2. Method of claim 1, wherein the devices are memory cells accessed with word lines and bit lines, and wherein the floating gate separator is arranged to separate along the direction of the word lines.

3. Method of claim 1, wherein the floating gate separator is not arranged to separate the floating gates in the direction of the bit lines.

4. Method for manufacturing an array of semiconductor devices on a substrate, each device having a floating gate, comprising:
    first forming isolation zones in the substrate,
    thereafter forming a floating gate separator on the isolation zones at locations where separations between adjacent floating gates are to be formed,
    after forming the floating gate separator, reducing the dimensions of the floating gate separator followed by forming the floating gates on the substrate between parts of the floating gate separator, and
    thereafter removing the floating gate separator so as to obtain slits in between neighboring floating gates.

5. Method according to claim 4, wherein the dimensions of the floating gate separator are reduced to sub-lithographic dimensions.

6. Method according to claim 5, wherein the dimensions of the floating gate separator are reduced to between 100 nm and 40 nm.

7. Method according to claim 4, wherein the dimensions of the floating gate separator are reduced by resist shrink.

8. Method according to claim 4, wherein the dimensions of the floating gate separator are reduced by trim plasma etching.

9. Method according to claim 4, wherein the dimensions of the floating gate separator are reduced by an isotropic over-etch of the floating gate separator.

10. Method according to claim 4, wherein the dimensions of the floating gate separator are reduced by phase-shift lithography.

11. Method according to claim 4, wherein the floating gate separator comprises nitride material.

12. Method according to claim 4, wherein the floating gate separator comprises at least two layers of different material.

13. Method according to claim 4, furthermore comprising forming spacers next to the floating gate separator before forming the floating gates.

14. An array of semiconductor devices with a floating-gate to control-gate coupling ratio, comprising:
- a substrate with a planar surface,
- an isolation zone in the substrate in and substantially planar with the planar surface,
- at least two floating gates extending on the substrate in a first direction, each floating gate partially overlapping the isolation zone and comprising floating gate material,
- a slit between the two floating gates, and
- a control gate extending laterally with respect to the planar surface over the floating gates,
- wherein at least one of the floating gates is provided with a sharp tip of floating gate material both in the first direction and in a second direction including an angle with the first direction.

15. Array of semiconductor devices according to claim 14, wherein at least one of the floating gates has a flat top surface.

16. Array of semiconductor devices according to claim 14, wherein at least one of the floating gates has a flat top surface and wherein array includes a plurality of memory cells, each cell including a control gate configured and arranged as recited in claim 14.

17. Array of semiconductor devices according to claim 14, and wherein array includes a plurality of memory cells, each cell including a control gate configured and arranged as recited in claim 14.

18. Array of semiconductor devices according to claim 17 wherein each of the memory cells is a nonvolatile memory cell.

* * * * *